United States Patent
Iwasaki et al.

(10) Patent No.: US 7,126,975 B2
(45) Date of Patent: Oct. 24, 2006

(54) ELECTRON-BEAM EXCITATION LASER

(75) Inventors: Tatsuya Iwasaki, Tokyo (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 35 days.

(21) Appl. No.: 10/861,290

(22) Filed: Jun. 3, 2004

(65) Prior Publication Data
US 2004/0218651 A1    Nov. 4, 2004

Related U.S. Application Data

(62) Division of application No. 09/796,474, filed on Mar. 2, 2001, now abandoned.

(30) Foreign Application Priority Data
Mar. 3, 2000    (JP)    ............................. 2000-059209

(51) Int. Cl.
*H01S 3/08* (2006.01)
*H01S 3/09* (2006.01)

(52) U.S. Cl. .............................. 372/69; 372/74; 372/99

(58) Field of Classification Search ................ 372/2, 372/69, 73–74, 92, 98–99, 102
See application file for complete search history.

(56) References Cited

U.S. PATENT DOCUMENTS

| | | | |
|---|---|---|---|
| 4,503,447 A * | 3/1985 | Iafrate et al. ................ 257/15 |
| 5,335,240 A * | 8/1994 | Ho et al. ...................... 372/39 |
| 5,406,573 A * | 4/1995 | Ozbay et al. ............ 372/43.01 |
| 5,440,421 A * | 8/1995 | Fan et al. .................... 359/245 |
| 5,471,180 A * | 11/1995 | Brommer et al. ........... 333/202 |
| 5,473,396 A | 12/1995 | Okajima et al. ............ 353/122 |
| 5,600,483 A | 2/1997 | Fan et al. .................... 359/245 |
| 5,617,445 A * | 4/1997 | Jewell ......................... 372/96 |
| 5,684,817 A * | 11/1997 | Houdre et al. ........... 372/45.01 |
| 5,784,400 A * | 7/1998 | Joannopoulos et al. ....... 372/96 |
| 5,804,919 A * | 9/1998 | Jacobsen et al. ............ 313/506 |
| 5,807,764 A | 9/1998 | Rice et al. .................... 438/29 |
| 5,955,749 A * | 9/1999 | Joannopoulos et al. ...... 257/98 |

(Continued)

FOREIGN PATENT DOCUMENTS

JP    6-89075    3/1994

(Continued)

OTHER PUBLICATIONS

Furneaux, R.C., et al., "The Formation of Controlled-porosity Membranes from a Radically Oxidize Aluminum", NATURE, vol. 337, No. 6203, pp. 147-149 (1989).

*Primary Examiner*—James Menefee
*Assistant Examiner*—Phillip Nguyen
(74) *Attorney, Agent, or Firm*—Fitzpatrick, Cella, Harper & Scinto

(57) ABSTRACT

An electron-beam excitation laser has a laser structure with a light emitter and reflectors on one hand and an electron source on the other hand, wherein at least part of the light emitter or reflectors has a multidimensional photonic crystal structure. An electron-beam excitation laser includes an electron source emitting electrons and a laser structure consisting of a light emitter and reflectors, accelerates electrons from the electron source, and irradiates the electrons to the laser structure to emit a laser beam from the laser structure, wherein the reflectors and/or the light emitter in the laser structure are formed with multidimensional photonic crystals in which dielectrics with different dielectric constants are arrayed in a plurality of directions at periodic intervals, and one of the dielectrics with different dielectric constants may be formed with a light-emitting material.

21 Claims, 13 Drawing Sheets

U.S. PATENT DOCUMENTS

| | | | |
|---|---|---|---|
| 5,999,308 A * | 12/1999 | Nelson et al. | 359/321 |
| 6,093,246 A * | 7/2000 | Lin et al. | 117/92 |
| 6,130,780 A * | 10/2000 | Joannopoulos et al. | 359/584 |
| 6,139,713 A * | 10/2000 | Masuda et al. | 205/206 |
| 6,147,449 A | 11/2000 | Iwasaki et al. | 313/495 |
| 6,149,480 A | 11/2000 | Iwasaki et al. | 445/6 |
| 6,171,162 B1 | 1/2001 | Iwasaki et al. | 445/6 |
| 6,262,830 B1 | 7/2001 | Scalora | 359/248 |
| 6,348,761 B1 | 2/2002 | Nomura et al. | 313/495 |
| 6,358,653 B1 | 3/2002 | Turberfield et al. | 430/18 |
| 6,539,155 B1 * | 3/2003 | Broeng et al. | 385/125 |
| 2002/0016124 A1 | 2/2002 | Yamashita et al. | 445/6 |

FOREIGN PATENT DOCUMENTS

| | | |
|---|---|---|
| JP | 8-78769 | 3/1996 |
| JP | 8-162720 | 6/1996 |
| JP | 10-121292 | 5/1998 |
| JP | 10-284806 | 10/1998 |
| JP | 11-186657 | 7/1999 |
| JP | 11-200090 | 7/1999 |
| WO | WO 99/09439 | 2/1999 |

* cited by examiner

ELECTRON-BEAM EXCITATION LASER

This application is a division of U.S. Application Ser. No. 09/796,474, filed Mar. 2, 2001 now abandoned.

BACKGROUND OF THE INVENTION

1. Field of the Invention

The present invention relates to an electron-beam excitation laser, and more particularly, to an electron-beam excitation laser emitting light distributed from the visible region to the ultraviolet region. An electron-beam excitation laser according to the present invention can be used as a light source for a laser beam printer, an optical recorder, optical communications, a pointer, a display, and so on.

2. Related Background Art

A laser consists commonly of a laser medium, a resonator including a reflector, and an excitation source. A laser medium obtains energy from an excitation source to emit light with a specific wavelength, so that a laser beam is generated in a state that allows amplification with gain. An optical resonator reflects light emitted by the laser medium to return it to the medium. The light is caused to reciprocate many times to be progressively amplified thereby cause laser oscillation. Lasers come in various types according to what they use as a laser medium: a gas laser which uses a He—Ne mixture, argon gas or the like; a solid laser which uses Nd:YAG, Ti:sapphire or the like; a dye laser which uses a dye; and a semiconductor laser which uses a semiconductor made of GaAlAs or the like. An optical excitation laser which uses light, a current injection laser which uses current, an electron-beam excitation laser which uses an electron beam. As excitation source, such lasers are known as: a light excitation laser which uses light; a current injection laser which uses current; and an electron beam excitation laser which uses electron beam. Resonators include a Fabry-Perot resonator, which uses a reflector, a prism, and a diffraction grating, and a ring resonator. Semiconductor lasers include those which use a cleavage plane or a multilayer film as a reflecting surface, distribution feedback (DFB) lasers, and distribution Bragg reflection (DBR) lasers.

A semiconductor laser is small and light, consumes a small amount of electric power, and offers high electricity-light conversion efficiency. To provide a higher-density optical recorder and a color display (refer to Japanese Patent Application Laid-Open No. 6-89075), a small laser is hoped for which emits light with a short wavelength, especially light distributed from the blue region to the ultraviolet region. For a reason of the exposure performance of a laser beam printer also, such a small laser is demanded. However, it is difficult to cause laser oscillation by current injection, using a wide-band-gap semiconductor because of its electrical characteristics, such as the fact that such a semiconductor cannot freely be doped. On the other hand, all types of direct-gap semiconductors, especially direct-gap semiconductors which are difficult to use for current injection lasers can be used for electron-beam excitation lasers. Because of this, direct-gap semiconductors are expected to be used for laser oscillation from the ultraviolet region to the infrared region.

A common electron-beam excitation laser will be described below. FIG. 17 shows the structure of a conventional electron-beam excitation laser. In the figure, a reference numeral 101 indicates a substrate; 102, a light emitter (active layer); and 103 and 104, reflectors. When electrons are emitted from an electron source, not shown, the light emitter 102 is excited, and the reflectors 103 and 104 serves as resonators, so that laser oscillation occurs, thus emitting a laser beam. In FIG. 17, a reference numeral 200 indicates a direction of electron emission, and a reference numeral 300 indicates a direction of laser beam emission. Such is also the case with other figures. Semiconductors containing a group II–VI group compound, such as ZnS, CdTe, or ZnSe, are mainly used for the active layer. As a light reflector, are used a substrate cleavage plane, a metal reflector made of Al or the like, dielectric multilayer film made of $SiO_2$, $TiO_2$, or the like, and multilayer reflector, that is, a combination of two compound semiconductors with different refractive indexes are used for the reflectors constituting a resonator.

A small electron-beam excitation laser has been reported which was designed using a spint type electron emitting diode and a CdTe/CdMnTe-based laser structure (Applied Physics Letters, Vol. 62, p. 796, 1993).

The following problems have prevented conventional electron-beam excitation lasers as described above from being brought into practical use:

(1) Conventional electron-beam excitation lasers are low in light emission efficiency and high in oscillation threshold value. Laser oscillation occurs over a wide wavelength region in various modes.

(2) When a thick reflecting layer is provided so that its side to which an electron beam is irradiated has sufficient light reflecting capability, an electron beam attenuates by the time it reaches the active layer, thus lowering light emission efficiency. To prevent such a reduction in light emission efficiency, electron-beam accelerating voltage must be increased.

(3) Because a laser structure (a semiconductor layer) is made by vapor-phase growth methods, such as MBE and CBE, the structure is costly, so that lasers using such a structure are difficult to offer at low cost.

SUMMARY OF THE INVENTION

In light of the foregoing, it is an object of the present invention to provide a high-performance electron-beam excitation laser which features improved light emission efficiency, a reduced oscillation threshold value, a narrow laser oscillation wavelength range, a reduced number of laser oscillation modes, and the like and is easy to produce at low cost.

An electron-beam oscillation laser according to the present invention which has a laser structure with a light emitter and reflectors on one hand and an electron source on the other hand, wherein at least either the reflectors or light emitter has a multidimensional photonic structure.

Specifically, an electron-beam excitation laser according to the present invention which includes an electron source emitting electrons and a laser structure consisting of a light emitter and reflectors, accelerates electrons from the electron source, and irradiates the electrons to the laser structure to emit a laser beam from the laser structure, wherein the reflectors in the laser structure are formed with multidimensional photonic crystals in which dielectrics with different dielectric constants are arrayed in a plurality of directions at periodic intervals.

An electron-beam excitation laser according to the present invention which includes an electron source emitting electrons and a laser structure consisting of a light emitter and reflectors, accelerates electrons from the electron source, and irradiates the electrons to the laser structure to emit a laser beam from the laser structure, wherein the light emitter in the laser structure is formed with a multidimensional photonic crystal in which dielectrics with different dielectric constants are arrayed in a plurality of directions at periodic intervals, and one of the dielectrics with different dielectric constants is formed with a light-emitting material.

An electron-beam excitation laser according to the present invention which includes an electron source emitting electrons and a laser structure consisting of a light emitter and reflectors, accelerates electrons from the electron source, and irradiates the electrons to the laser structure to emit a laser beam from the laser structure, wherein the light emitter and reflectors in the laser structure are formed with multi-dimensional photonic crystals in which dielectrics with different dielectric constants are arrayed in a plurality of directions at periodic intervals, and one of the dielectrics with different dielectric constants in the multidimensional photonic crystal forming the light emitter is formed with a light-emitting material.

According to the present invention, using multidimensional photonic crystals for reflectors in a laser structure allows light confinement to be effective, laser efficiency to increase, the laser oscillation wavelength range to be narrow, and the probability of laser oscillation in a single mode to increase. Especially, making part of the reflector on the side of electron-beam emission vacuum provides the reflector with both satisfactory reflection performance and a sufficient electron-beam transmittance, thus allowing laser oscillation to occur at a low threshold value (i.e., at a low acceleration voltage).

According to the present invention, using a multidimensional photonic crystal for a light emitter in a laser structure allows laser efficiency to increase, the laser oscillation wavelength range to be narrow, and the probability of laser oscillation in a single mode to increase in a mode in which photonic band group velocity is low and a local mode accompanying defects. Using multidimensional photonic crystals for both a light emitter and reflectors in a laser structure offers more advantages and higher performance, compared with using a multidimensional photonic crystal for either the light emitter or reflectors. Giving a multidimensional photonic crystal an anodized alumina nanohole structure allows an electron-beam excitation laser to be easily made at low cost.

DESCRIPTION OF THE PREFERRED EMBODIMENT

Figure 1:
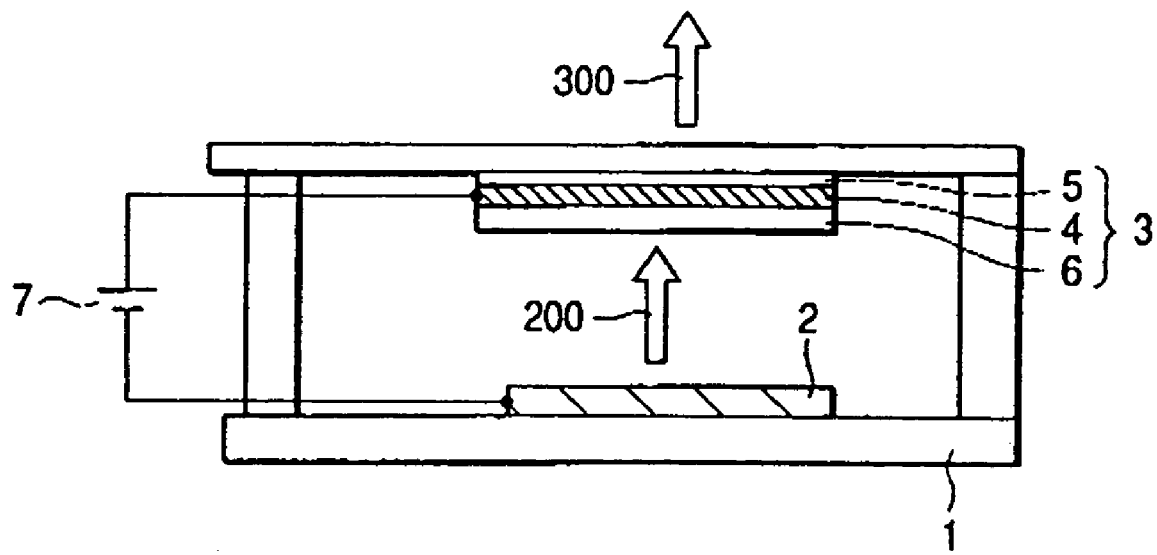
FIG. 1 shows the structure of an electron-beam excitation laser of the present invention.

Referring now to the drawings, embodiments of the present invention will be described in detail below. FIG. 1 shows an electron-beam excitation laser of the present invention. In the figure, a reference numeral 1 indicates a vacuum container. An electron source 2 which emits electrons is disposed at the bottom of the vacuum container 1, and a laser structure 3 which produces a laser beam is disposed opposite to the electron source 2 under the top of the vacuum container 1. The laser structure 3 consists of a light emitter (a light-emitting layer) 4 and reflectors (reflecting layers) 5 and 6 which sandwich the light emitter. The reflectors 5 and 6 serve as a resonator which repeatedly reflect light from the light emitter 4. Electron accelerating means 7 is a power supply which applies a predetermined voltage between the electron source 2 and laser structure 3 to accelerate electrons from the electron source 2.

Electron emission devices, such as a thermoelectron emission device, an electric-field emission device, an MIM type electron emission device, surface conduction type electron emission device, can be used as the electron source 2. To reduce a laser in size, electron emission devices are preferably used which are small and highly efficient and can be formed on a substrate, such as a spint type electric-field emission device, an MIM type electron emission device, and a surface conduction type electron emission device. As the electron source 2, electron emission materials which are good at emitting electrons, such as diamond and carbon nanotubes, may be disposed opposite to the laser structure on a substrate. A photoelectron emission device can be used as the electron source 2. When a photoelectron emission device is used in such a manner, electrons emitted from the photoelectron emission device due to input light are accelerated using electron accelerating means and irradiated to the laser structure, so that output light is emitted from the laser structure. This means that an optical amplifier and a light-light converter are provided. The electron accelerating means can be controlled to modulate the amplifier.

A power supply or a pulse power supply which range in voltage from 10 V to 100 kV can be used as the electron accelerating means 7. A DC power supply and a pulse power supply can provide continuous laser-beam oscillation and pulsed laser-beam oscillation, respectively. An electron-beam focusing electrode can be disposed in the vacuum container 1 to control the electron-beam diameter.

Figure 2:
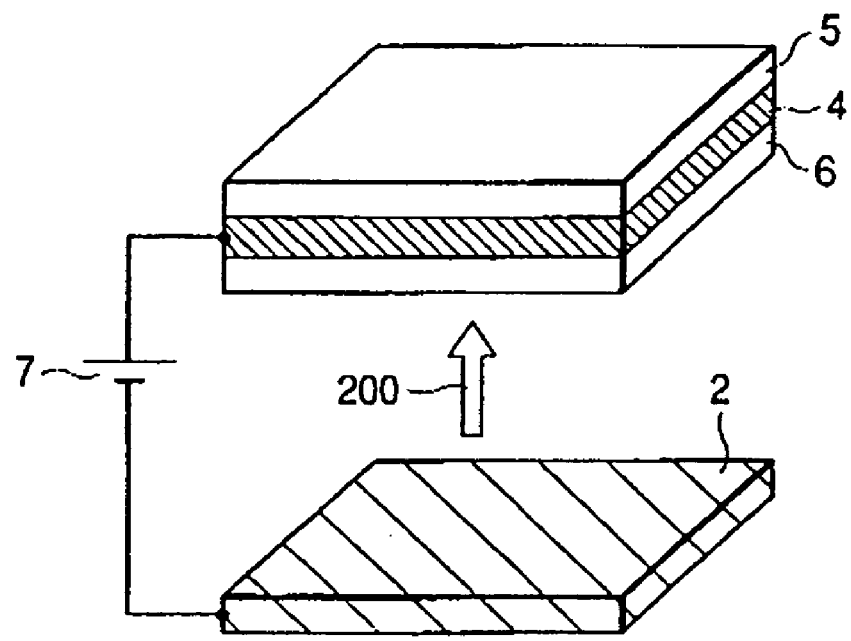
FIG. 2 is a perspective view of the laser structure in FIG. 1.
Figure 3:
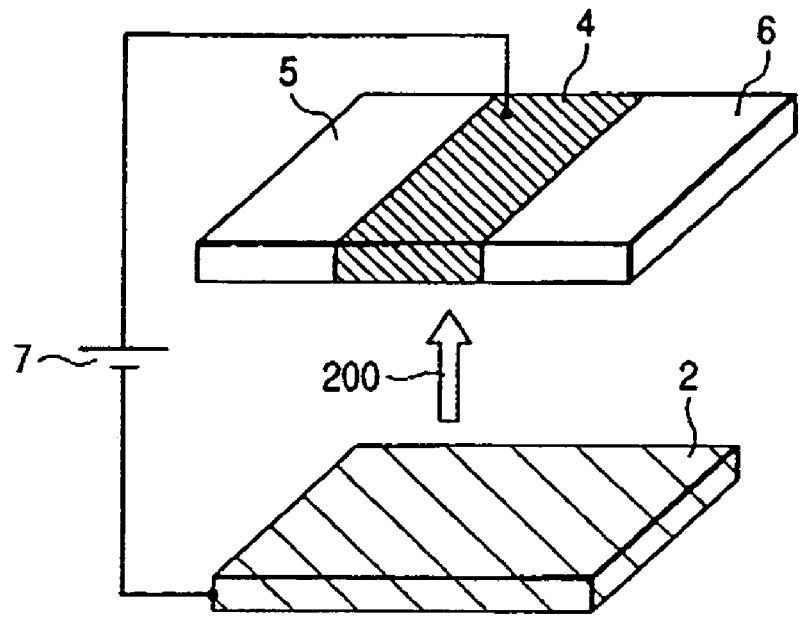
FIG. 3 is a perspective view of another laser structure.
Figure 4:
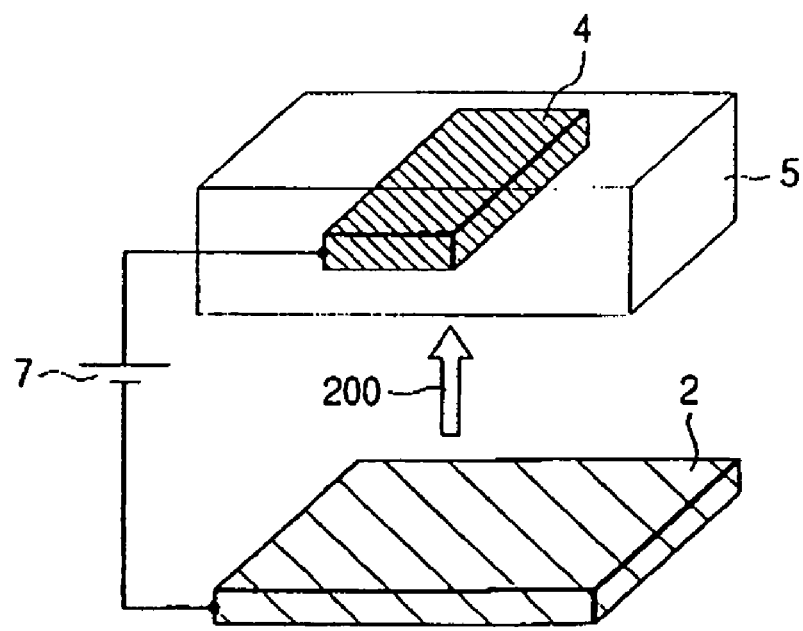
FIG. 4 is a perspective view of still another laser structure.
Figure 5:
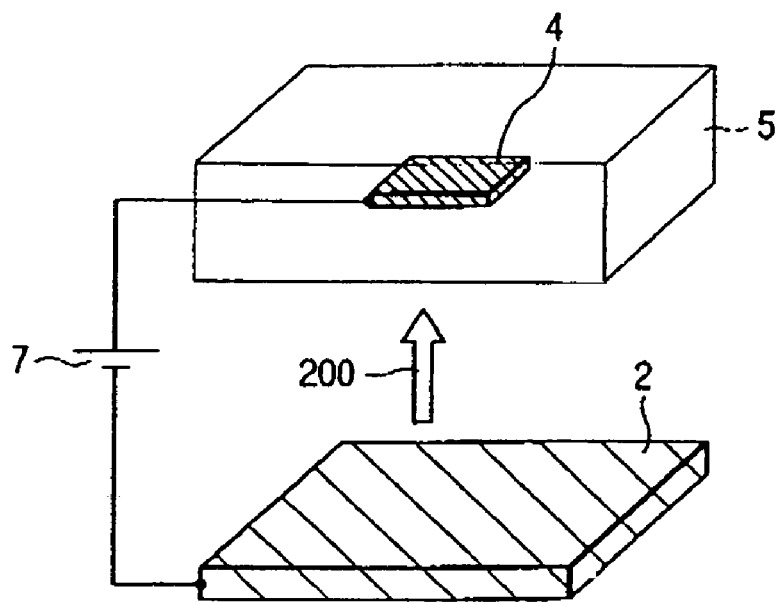
FIG. 5 is a perspective view of a further laser structure.

As described above, the laser structure 3 consists of the light emitter 4 and reflectors 5 and 6, which serve as a resonator. In the embodiment in FIG. 1, the laser structure 3 is structured by interposing the light emitter 4 between the reflectors 5 and 6 as shown in FIG. 2. Variations of the laser structure 3 are available. For example, the light emitter 4 and reflectors 5 and 6 are disposed side by side, with the emitter in between, as shown in FIG. 3; the light emitter 4 is embedded in the reflector 6 so that the reflector is in contact with the top, bottom, and sides of the emitter 4, as shown in FIG. 4; and the entire light emitter 4 is embedded in the reflector 5, as shown in FIG. 5.

Figure 6:
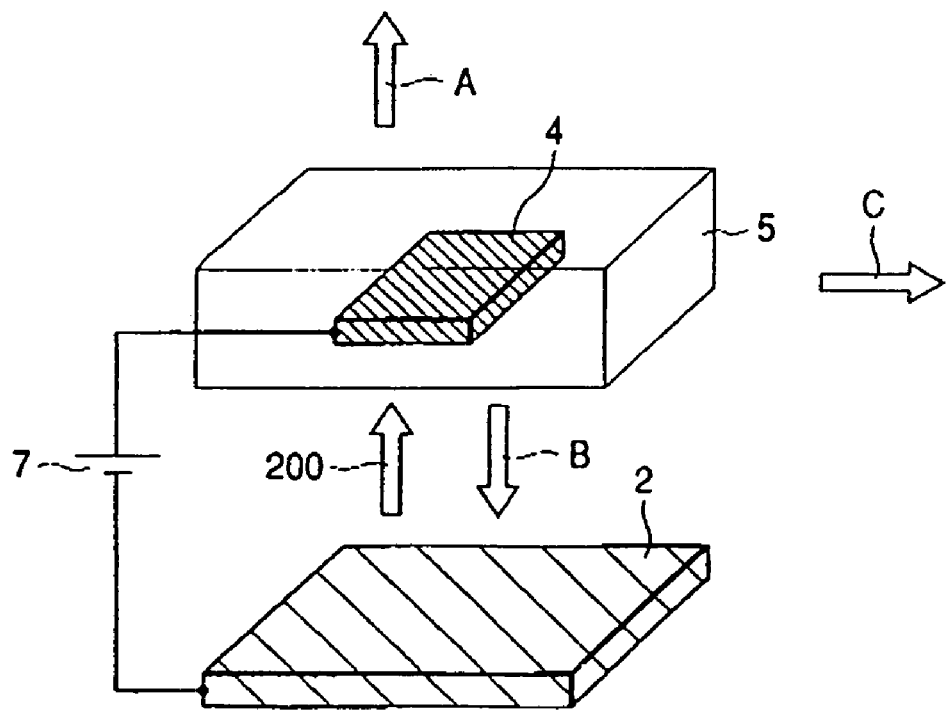
FIG. 6 shows a direction of laser beam emission.

When a predetermined voltage is applied to the electron source 2, using the electron accelerating means 7, electrons from the electron source 2 are accelerated and irradiated to the laser structure 3. Irradiating electrons to the laser structure excites the light emitter 4 in the structure 3 and makes the reflectors 5 and 6 serve as a resonator. Thus laser oscillation occurs, so that a laser beam is emitted. Appropriately setting the reflectance of the reflectors in each of the laser structures in FIGS. 2 through 5 allows any of the following laser beam emission directions to be chosen at will: (1) the direction in parallel with the direction of electron incidence (the direction of an arrow A), as shown in FIG. 6, (2) the direction opposite to the direction in parallel with the direction of electron incidence (the direction of an arrow B), and (3) the direction at right angles to the direction of electron incidence (the direction of an arrow C).

Figure 7:
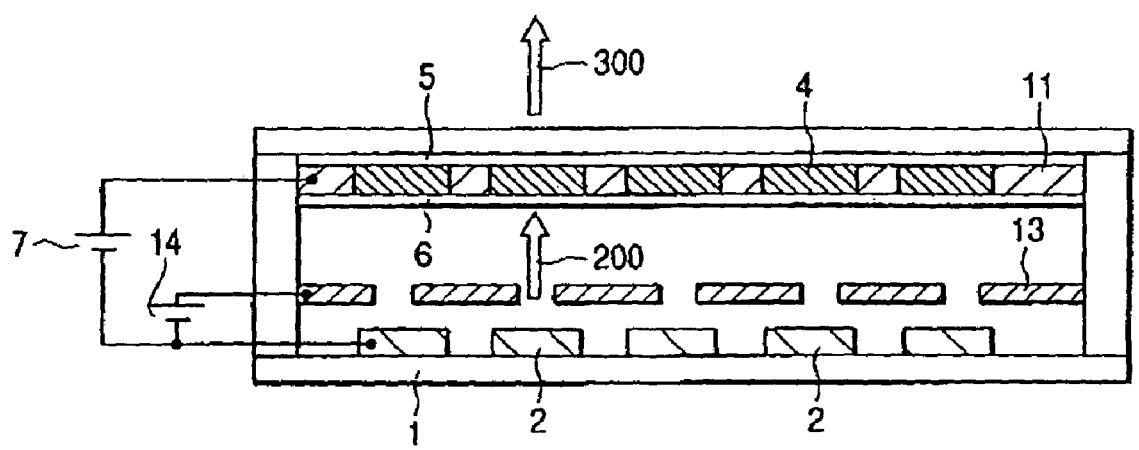
FIG. 7 shows a multi-electron-beam laser.

When a plurality of electron sources 2 are disposed in the vacuum container 1 as shown in FIG. 7, a plurality of laser structures 3 can be disposed opposite to each of the plurality of electron sources. Disposing a plurality of electron sources 2 and laser structures 3 in such a manner provides a multi-electron-beam excitation laser which emit a plurality of laser beams at a time. In FIG. 7, a reference numeral 4 indicates a light emitter; 5, 6, and 11, reflectors; 7, electron accelerating means; 13, a control electrode; and 14, electron number controlling means. In the following description, parts with the same function are provided with the same reference numeral. Applying a predetermined voltage between the electron sources 2 and the control electrode 13, using the electron quantity controlling means 14 allows the number of electrons from the electron sources 2 to be controlled. Such an arrangement can be applied to the apparatus in FIG. 1.

Material for the laser structure 3 will be described below. Any light-emitting material which emits light distributed over the ultraviolet, visible, and infrared regions may be used as a laser medium forming the light emitter 4 in the laser structure 3. Such material includes a semiconductor, a fluorescent substance, dye, and light-emitting glass. A direct-transition semiconductor can preferably be used which is made from a group II-group VII compound such as ZnO, ZnS, or CdS; a group IIIb-group V compound such as AlAs or GaP; a group III-group V compound such as GaN or AlN; a chalcogenide compound, such as MgS or MnS; or a mixed crystal of these compounds.

Available fluorescent substances include red fluorescent substances for CRTs, such as $Zn_3(PO_4)_2:Mn^{2+}$; $(Zn, Cd)S:Ag$, $YVO_4:Eu^{+3}$, $Y_2O_3:Eu^{3+}$ and $Y_2O_2S:Eu^{3+}$; green fluorescent substances such as $Y_3Al_5O_{12}: Tb^{3+}$; blue fluorescent substances, such as ZnS:Ag; and $(La, Y) OBr:Ce^{3+}$, $(La, Gd)OBr:Ce^{3+}$ and so forth. Fluorescent substances used for light-emitting displays excited by an electron beam of a low voltage ranging from 10 to 100 V may also be used, including ZnO:Zn, $SnO_2:Eu^{+3}$, and $Y_2O_3:Eu^{3+}In_2O_3$.

Figure 8A:
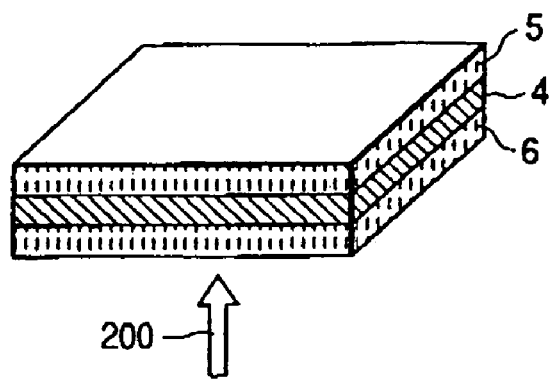
FIGS. 8A, 8B and 8C show a laser structure whose reflector only is made of a photonic crystal, a laser structure whose light emitters only are made of a photonic crystal, and a laser structure whose reflector and light emitters are made of a photonic crystal.
Figure 8B:
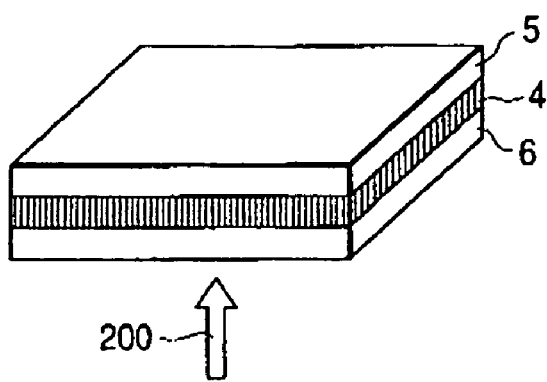
Figure 8C:
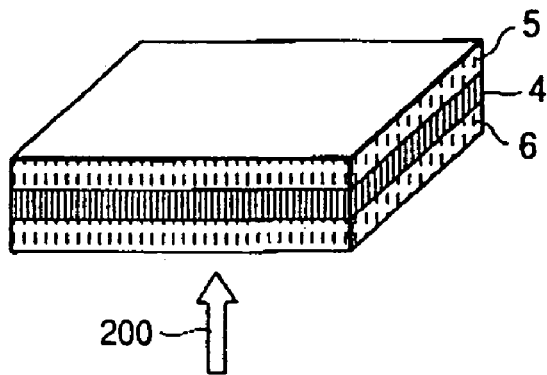

The reflectors may be made of multidimensional photonic crystal, described later; a substrate cleavage plane; a metal, such as Al, Ag, or the like; a multi layer of $SiO_2$ and $TiO_2$ or a multi layer with a combination of two compound semiconductors or the like with different refractive indexes. The embodiment uses a multidimensional photonic crystal especially for the laser structure 3. Specifically, a multidimensional photonic crystal is used for the reflectors 5 and 6 in the laser structure 3 as shown in FIG. 8A, for the light emitter 4 in the laser structure 3 as shown in FIG. 8B, or for the reflectors 5 and 6 and light emitter 4 as shown in FIG. 8C. In FIG. 8A, either of the reflectors, which sandwich the light emitter 4, may be a multidimensional photonic crystal.

The photonic crystal, which is detailed in "Photonic Crystals," J. D. Joannnopoulous et al., Princeton University Press, 1995, pp. 94–104, will be briefly described below. The photonic crystal has an artificial multidimensional periodic structure, which is formed by periodically arranging two types or more of dielectrics with different refractive indexes (dielectric constants). In such a medium, periodicity of the refractive index in the order of wave length generates the photonic bands in an analogy to the band generation theory semiconductors in which an electron wave is Bragg-reflected so that the dispersion relation between Energy E and wave number k generates bands. A wavelength region where no light exists, that is, a photonic band gap is formed, depending on the periodic structure. To control such a photonic band, its structural interval needs to be about the light wavelength to a fraction of the light wavelength.

Figure 9A:
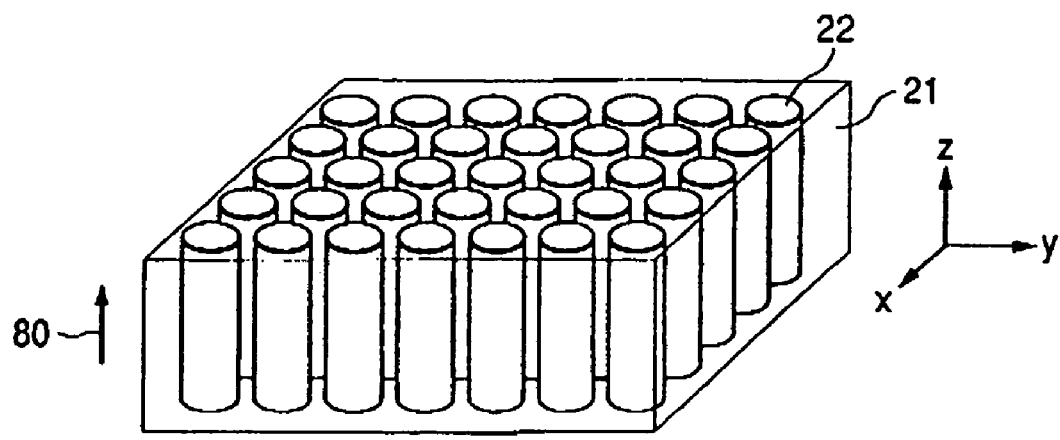
FIGS. 9A, 9B and 9C show a two-dimensional photonic crystal.
Figure 9B:
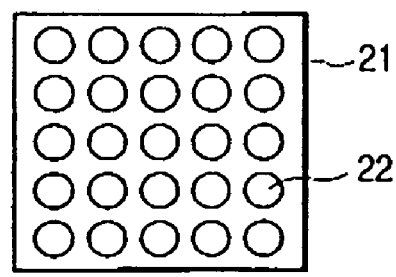
Figure 9C:
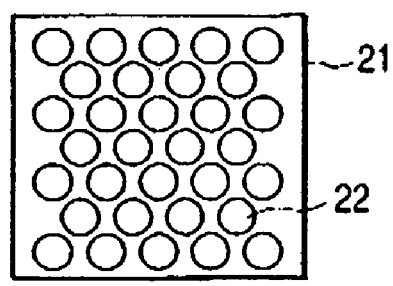

Photonic crystals are classified according to their periodic dimensional number into the following: (1) one-dimensional (1D), (2) two-dimensional (2D), and (3) three-dimensional (3D). The 1D photonic crystal has a structure which is periodic one-dimensionally. For example, laminated film and the DFB structure are made of a 1D crystal. The 2D photonic crystal has a structure which is periodic two-dimensionally (that is, in the x and y directions). For example, as shown in FIGS. 9A, 9B and 9C, the structure is formed by regularly arraying in a first dielectric 21 cylindrical second dielectrics 22 which differ in dielectric constant from the first dielectric. The second dielectrics 22, which have a brachyaxis shorter than the wavelength of light emitted, are regularly and two-dimensionally arrayed in the first dielectric 21 at intervals shorter than the wavelength of light emitted. FIG. 9A is a schematic perspective view of the structure of a 2D photonic crystal, and FIG. 9B is its plan view. The second dielectrics 22 are arrayed squarely. As shown in FIG. 9C, the second dielectrics 22 may be arrayed triangularly.

Figure 10A:
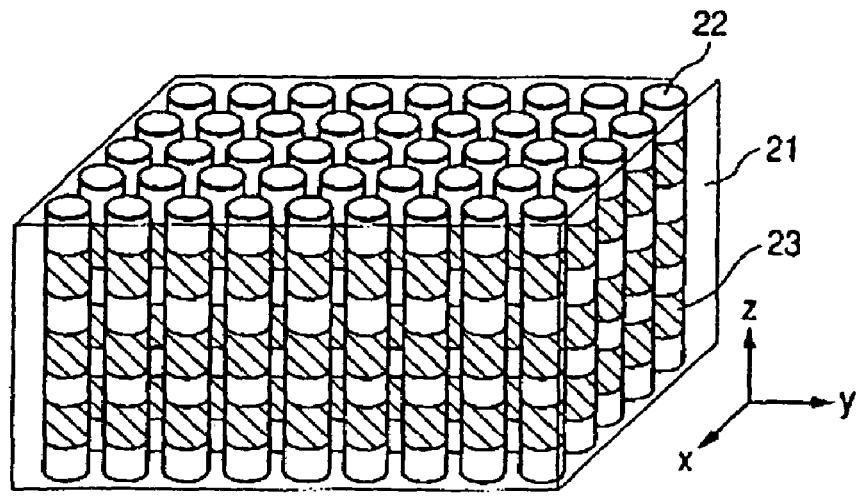
FIGS. 10A, 10B and 10C show a three-dimensional photonic crystal.
Figure 10B:
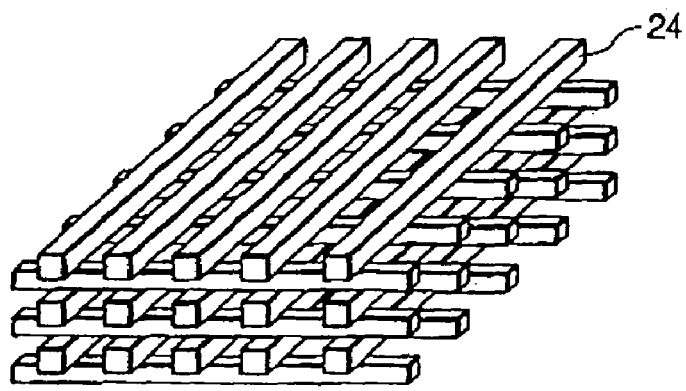
Figure 10C:
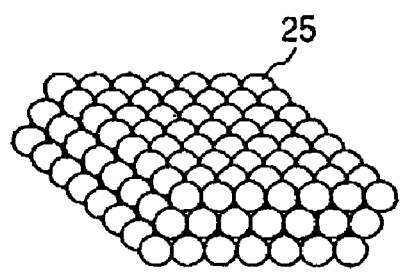

The 3D photonic crystal has a structure which is periodic three-dimensionally. For example, as shown in FIG. 10A, the 3D photonic crystal can be provided by making the 2D photonic crystal (FIG. 9A) periodic in the z direction. To make the 2D photonic crystal periodic in the z direction, third dielectrics 23 are provided between cylindrical second dielectrics. The first through third dielectrics 21 to 23 differ in dielectric constant. As shown in FIG. 10B, a structure is available which is formed by periodically arraying dielectric spheres 24 alternately in the x and y directions to stack them in the z direction. As shown in FIG. 10C, dielectric spheres 25 can be stacked to provide the 3D photonic crystal. In FIG. 10B, the dielectric rods 24 provide first dielectrics, and air between the dielectric rods 24 provides second dielectrics. Such is also the case with FIG. 10C.

By way of example, the multidimensional photonic crystals have been specifically described above. When these photonic crystals are used for a reflector or a light emitter in a laser structure, any materials (including air and a vacuum) can be used as dielectrics with different dielectric constants. For example, in FIG. 9A, glass and silicon may be used as the first and second dielectrics 21 and 22, respectively, or glass and air may be used as the first and second dielectrics 21 and 22, respectively. Because making a photonic crystal mult-dimensional increases controllability of its band structure, thus providing an especially effective photonic band gap, a multidimensional photonic crystal, more specifically, a photonic crystal with a structure having two dimensions or more is preferably used.

For the photonic crystal, a photonic band due to its periodic structure increases light emission efficiency because of a reduction in the state density of wavelength of light emitted and anisotropic dispersion. A wider photonic band gap is preferable. It is preferable that the 2D photonic crystal be formed by regularly arraying cylindrical second dielectrics 22 in honeycomb formation in a first dielectric 21 so that they are symmetrical about six directions as shown in FIG. 9C, in that the photonic band gap is open.

Figure 11:
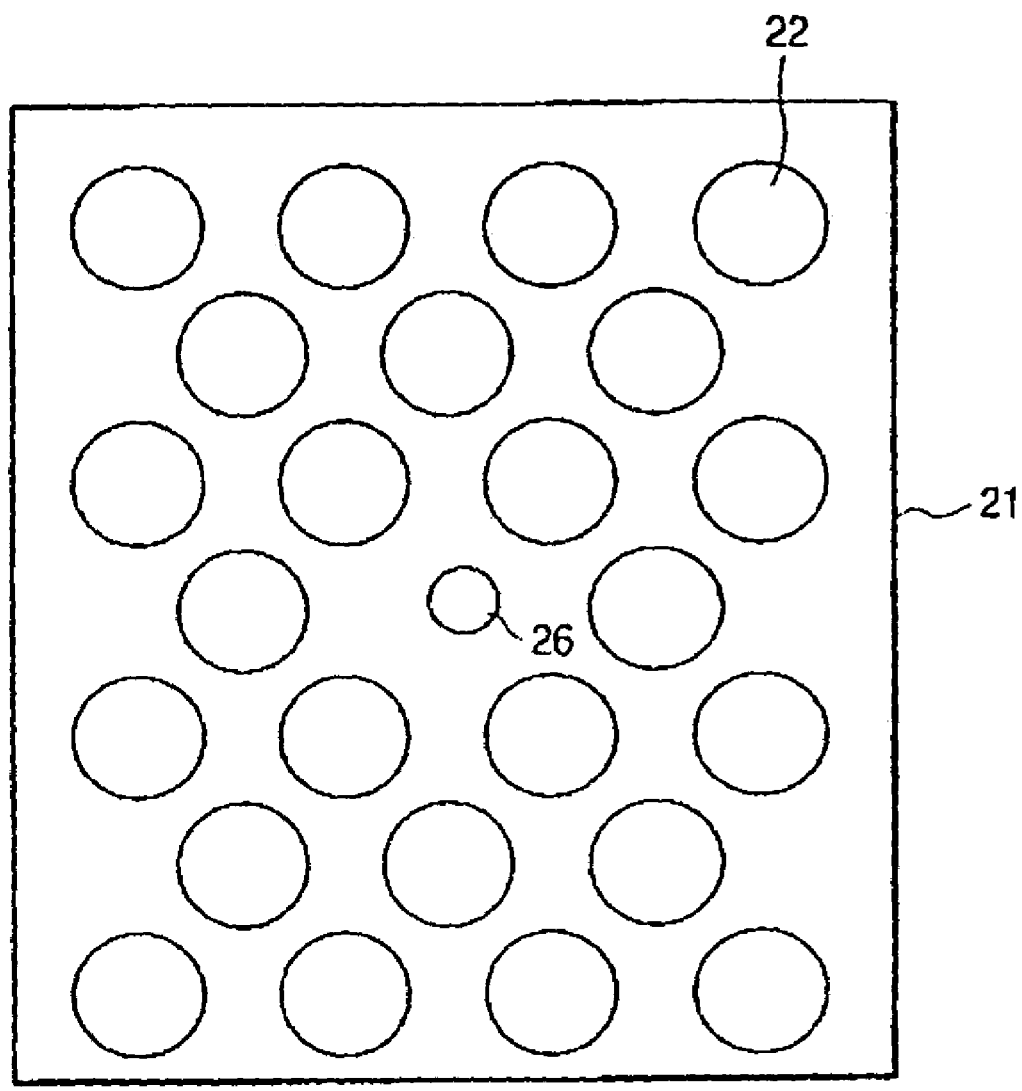
FIG. 11 shows a photonic crystal containing a defect.

Defects can be disposed in part of a photonic crystal. For example, as shown in FIG. 11, defects 26 with a small diameter are disposed in some of the cylindrical second dielectrics 22 which are regularly arrayed in the first dielectrics 21. These defects cause local disorder in the photonic crystal, so that the oscillation threshold value becomes smaller, thus easily providing laser oscillation in a single mode. The defects 26 have only to differ in diameter from the second dielectrics 22. Defects which are larger in diameter than the second dielectrics 22 may be used.

Figure 12A:
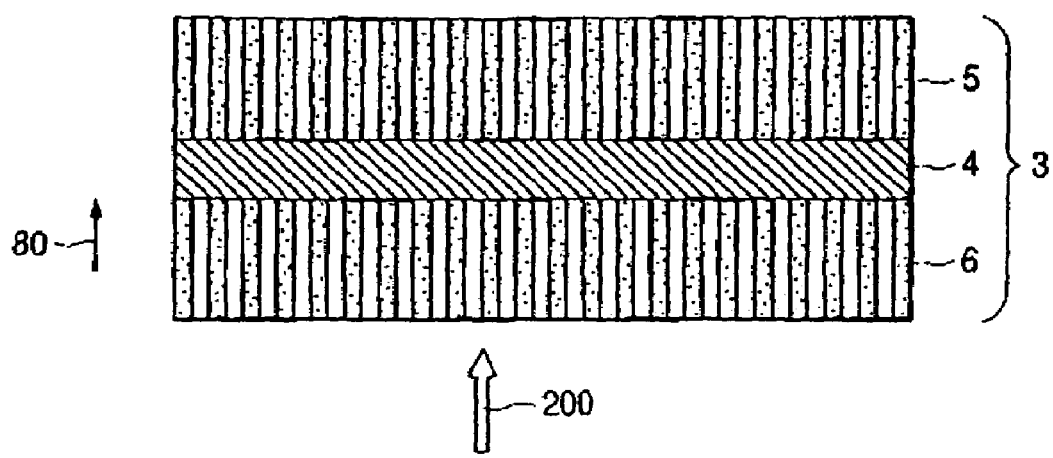
FIGS. 12A and 12B show a two-dimensional photonic crystal which is used for a reflector.
Figure 12B:
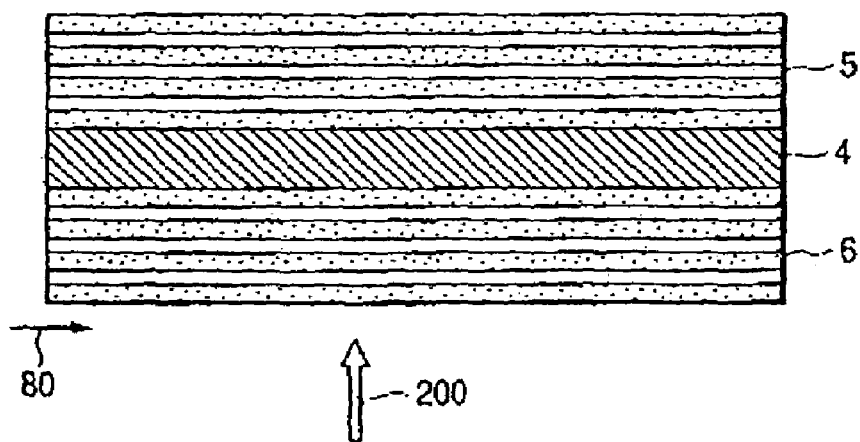

FIGS. 12A and 12B are sectional views showing a 2D photonic crystal used for a reflector in the laser structure 3. In the figures, the two-dimensionally formed structure is drawn periodically in only one direction, and black arrows 80 indicate directions in which the structure is not periodic. Such is also the case with other figures. FIG. 12A shows that the direction in which the photonic crystal is not periodic is in parallel with an electron incidence direction 200. FIG. 12B shows that the direction in which the photonic crystal is not periodic is at right angles to the electron incidence direction. Especially, when a photonic crystal is used for the reflector 6 on the side of electron incidence, its structure is desirably vacuum in part to increase distance traveled by electrons. This provides a reflecting layer which has both sufficient reflection performance and electron-beam transmittance, thus making laser oscillation possible at a low threshold value (a low acceleration voltage). If for a part of the dielectric is used vacuum to form a photonic crystal as described above, for example, the second dielectrics 22 in the 2D photonic crystal in FIG. 9A are made vacuum. When second dielectrics in the 2D photonic crystal in FIG. 12A are made vacuum, electrons are preferably irradiated to the crystal at right angles to the direction of its period to reduce electron energy loss and effectively excite the crystal.

Figure 13A:
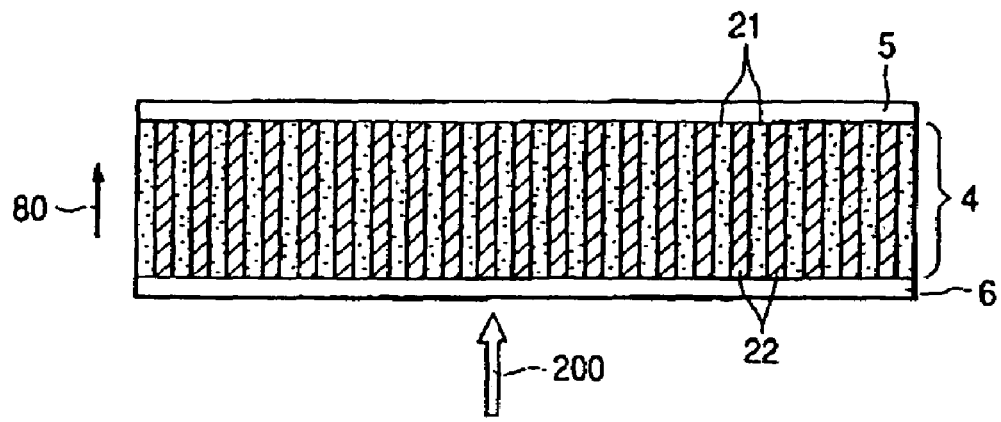
FIGS. 13A, 13B and 13C show two-dimensional photonic crystals which are used for light emitters.
Figure 13B:
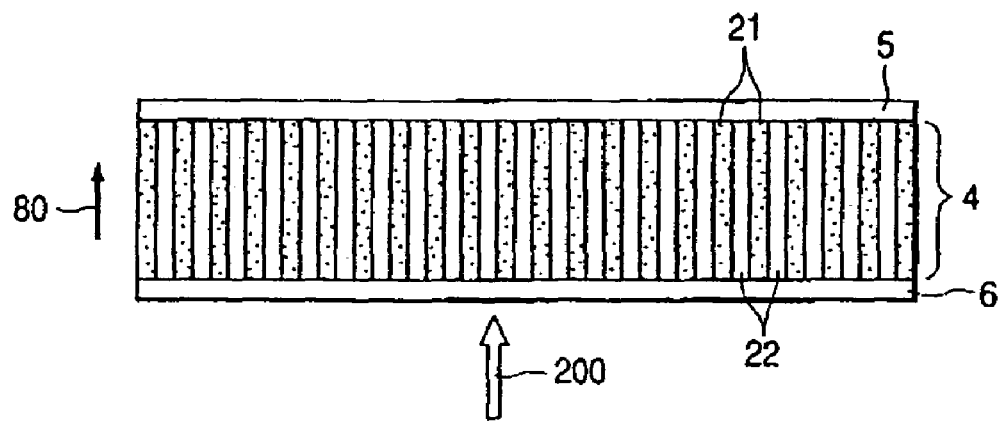
Figure 13C:
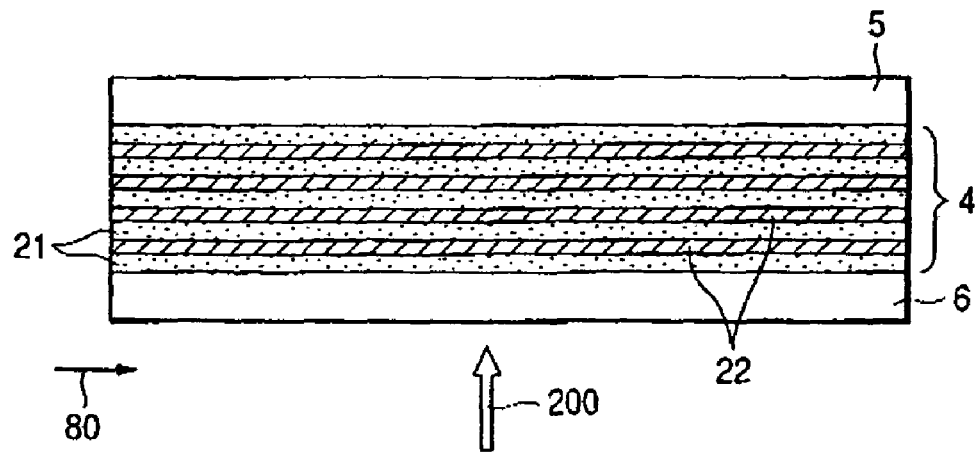

FIGS. 13A to 13C are sectional views of a 2D photonic crystal used for the light emitter 4 in the laser structure 3. FIGS. 13A and 13B show that the direction in which the 2D photonic crystal is not periodic is in parallel with an electron incidence direction, and FIG. 13C shows that the direction in which the 2D photonic crystal is not periodic is at right angles to the electron incidence direction. In FIG. 13A, a light-emitting material is used for the second dielectrics 22 in FIGS. 9A to 9C, and rods made of the light-emitting material are periodically arrayed between first dielectrics 21. In FIG. 13B, a light-emitting material is used for the first dielectrics 21 in FIGS. 9A to 9C, and the second dielectrics 22, which are voids, are periodically arrayed. In FIG. 13C, a light-emitting material is used for second dielectrics 22 as shown in FIG. 13A, and these dielectrics are periodically arrayed.

Figure 14A:
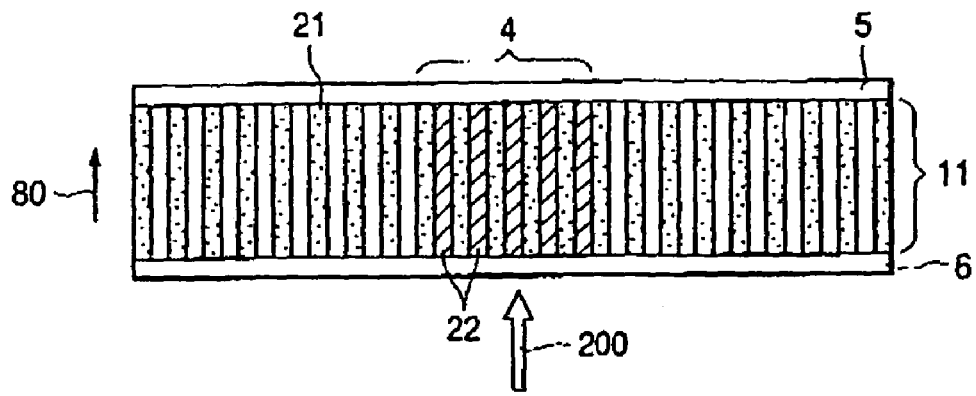
FIGS. 14A, 14B and 14C show two-dimensional photonic crystals which are used for a reflector and light emitters.
Figure 14B:
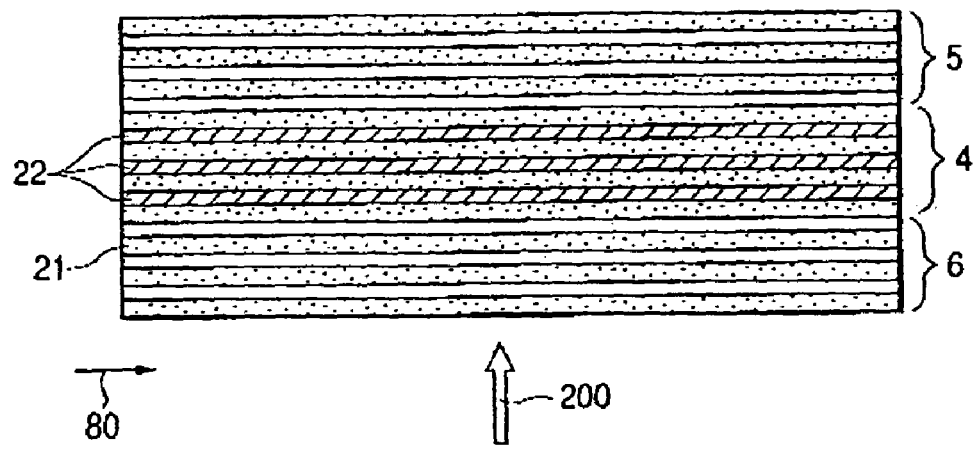
Figure 14C:
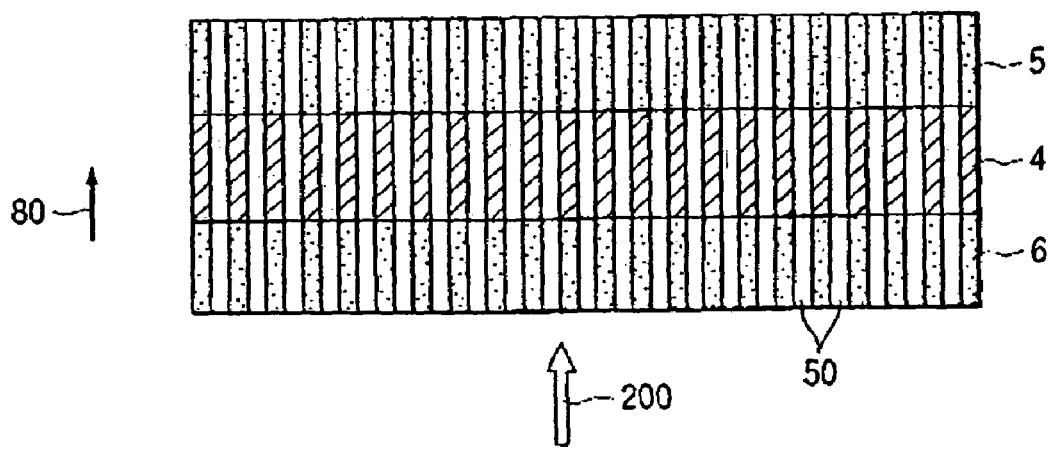

FIGS. 14A to 14C are sectional views of 2D photonic crystals used for a light emitter and a reflector. In FIG. 14A, the direction in which the 2D photonic crystal is not periodic is in parallel with an electron incidence direction, and a light-emitting material is used for a part of the 2D photonic crystal for second dielectrics 22 as described using FIG. 13A to form the light emitter 4 in the 2D photonic crystal. If the light emitter 4 is formed on the side of a laser structure center, reflectors 11 are formed with photonic crystals on both sides of the light emitter 4.

In FIG. 14B, the direction in which the 2D photonic crystal is not periodic is at right angles to an electron incidence direction, and a light-emitting material is used for a part of the 2D photonic crystal as in FIG. 14A to form the light emitter 4. A photonic crystal on top of the light emitter 4 is a reflector 5, and a photonic crystal at the bottom of the light emitter is a reflector 6. In FIG. 14C, a two-dimensional photonic crystal which contains periodic voids 50 is used for the reflectors 5 and 6, and a two-dimensional photonic crystal whose light-emitting material contains periodic voids 50 is used for the light emitter 4. The direction in which the two-dimensional photonic crystals as the reflectors and light emitter are not periodic is in parallel with an electron incidence direction.

If a 3D photonic crystal is used for the light emitter 4 in the laser structure 3, at least one of the first, second, and third dielectrics 21, 22, and 23 is made of a light-emitting material in FIG. 10A. In FIG. 10B, for example, all dielectric rods 24 or some of them are made of a light-emitting material. In FIG. 10C, dielectric spheres 25 need to be made of a light-emitting material, or gaps between the dielectric spheres 25 need to be filled with a light-emitting material.

Thes, using photonic crystals for the reflectors, light emitter, or both of these in the laser structure 3 offers the following advantages:

(1) Using a photonic band gap in a multidimensional photonic crystal for a reflector makes high-level light reflection and containment possible. This allows oscillation to easily occur in a single mode within a narrow frequency range and light emission anisotropy to be controlled using photonic-crystal multidimensionality.

(2) Periodically disposing a light-emitting material in a multidimensional photonic crystal increases light emission efficiency and reduces the oscillation threshold value. This is reasoned as follows. A photonic crystal allows an optical mode in which group velocity is low to be entered. Time of interaction between a material system and a radiation field is inversely proportional to group velocity. Thus a group velocity reduction is used to increase the amplification factor (O Plus E, Vol. 21, p. 1533, 1999).

(3) Introducing local disorder, that is, defects into a photonic crystal allows a mode in which light exists locally in a photonic band gap to be entered. If a light-emitting frequency is in the photonic band gap, spontaneous light emission and inductive light emission are prohibited because no optical mode in which light is emitted is available at frequencies other than frequencies in the above-described mode. Using such a photonic crystal with defects for a light emitter or a reflector causes the above-described mode to be entered, the frequency range for light emission and laser oscillation to be narrowed, and time and space coherence to be increased. This makes it easy to cause laser oscillation in a single mode at a low threshold value.

The multidimensional photonic crystal has the above-described advantages. However, the crystal is difficult to produce, it does not find wide application. Because a periodic structure several hundreds of nanometers in size needs to be formed to make a photonic crystal which emits light in the visible region, the crystal is difficult to make. To make a photonic crystal, techniques are used which include electron-beam exposure, dry etching, and selective growth. However, because these techniques pose problems of a poor yield, high cost, and so on, a spontaneously formed regular nanostructure is preferably used.

Spontaneously formed nanostructures include an array of fine spheres of polystyrene or the like, a bound of fine fibers, and anodized alumina film. Of these, anodized alumina film is the best, because anodizing, a simple technique, provides a two-dimensional periodic structure, that is, a 2D photonic crystal with a large area and a high aspect ratio. The interval can be adjusted to within a range of several tens of nanometers to five hundred nanometers, so that a photonic crystal can be made which emits light distributed from the visible region to the ultraviolet region. The anodized alumina nanohole will be described below.

Figure 15:
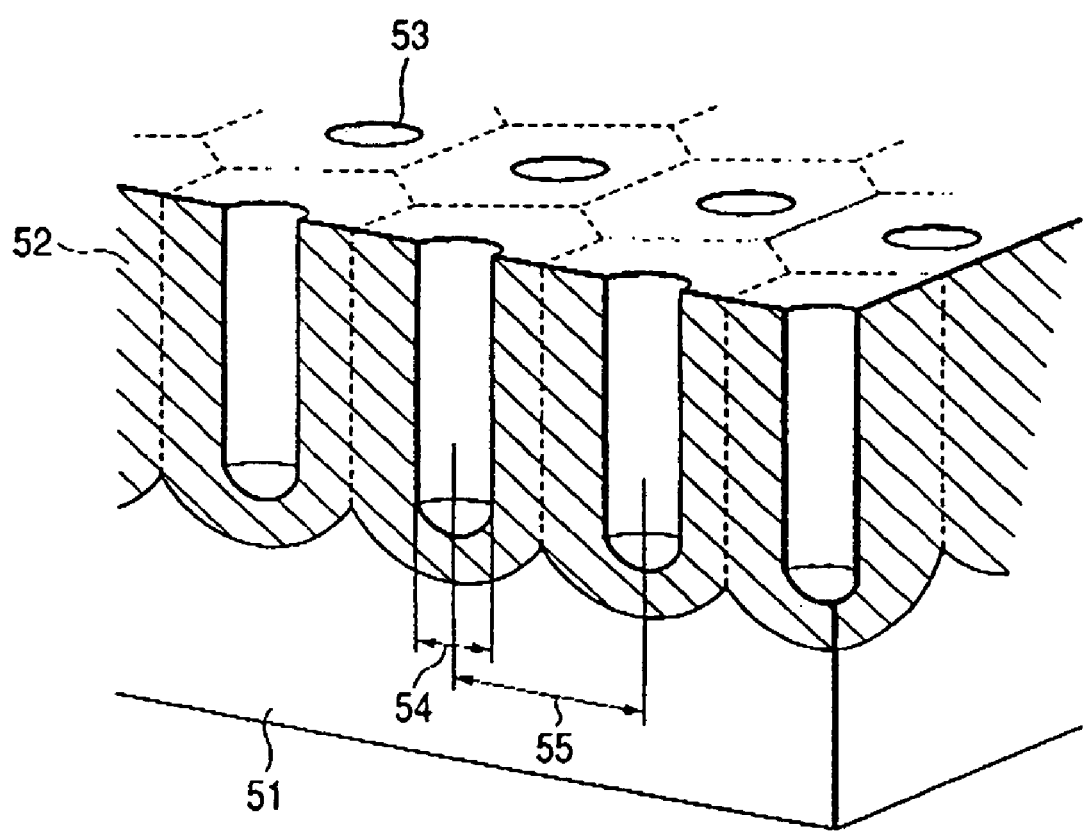
FIG. 15 shows a two-dimensional photonic crystal made of anodized alumina.

Anodized alumina nanoholes can be made by anodizing aluminum film, aluminum foil, an aluminum sheet, or the like in a certain oxidizing solution (refer to R. C. Furneaux, W. R. Rigby, & A. P. Davidson, NATURE, Vol. 337, p. 147, (1989). FIG. 15 schematically shows anodized alumina nanoholes. Anodized alumina 52, which consists mainly of aluminum, contains many cylindrical nanoholes 53. These nanoholes 53 are formed almost at right angles to the surface of a substrate. The nanoholes 53 are almost equally spaced so that they are parallel with each other. A reference numeral 51 indicates an aluminum sheet or aluminum film.

That is, the nanoholes 53 (which correspond to the cylindrical second dielectrics 22 in FIGS. 9A to 9C) are arrayed regularly in honeycomb formation in the anodized aluminum 52 (which corresponds to the first dielectrics 21 in FIGS. 9A to 9C). The diameter 2r of an alumina nanohole, which is indicated by a reference numeral 54, ranges from several nanometers to hundreds of nanometers. The interval 2R between the alumina nanoholes, which is indicated by a reference numeral 55, ranges from several tens of nanometers to several hundreds of nanometers. The diameter and interval can be controlled according to anodization conditions. By adjusting anodization time or the like, the thickness of the anodized alumina 52 and the depth of the nanoholes 53 can be controlled to within a range of 10 to 500 μm, for example. The diameter 2r can be increased by etching. A phosphoric acid solution or the like can be used for etching.

Two-stage anodizing or a method which forms honeycomb-like texture (concaves of nanohole start points) on an aluminum surface and then anodizing the surface can be used to regularly array holes (Masuda, OPTRONICS, No. 8, p. 221, 1998). Filling anodized-alumina nanoholes with dielectrics or a light-emitting material provides a highly functional 2D photonic crystal. Electrodeposition is an easy and highly controllable method for filling nanoholes. However, film forming methods including electrophoresis, application, penetration, CVD, or the like can also be used for that purpose. Anodized alumina can be used to easily make a 2D photonic crystal as described using FIGS. 9A to 9C. Using anodized alumina for the reflectors 5 and 6 and light emitter 4 in the laser structure 3 as described with reference to FIGS. 12A through 14C allows an inexpensive electron-beam excitation laser to be easily produced.

Embodiments of an electron-beam excitation laser of the present invention will be described in detail below. The inventor made a reflector for a laser structure made from anodized alumina (2D photonic crystal) as described with reference to FIG. 15 and tested the reflector to evaluate it. Embodiments 1 through 6 will be described below. In these embodiments, the laser structure 3 has a structure shown in FIGS. 12A and 12B. A CdS single crystal was used for the light emitter 4 in the laser structure 3. The CdS single crystal was polished until it was 15 μm thick and annealed in an Ar atmosphere at 550° C. for one hour. Then reflectors which consisted of 2D photonic crystals made from anodized alumina were formed on both sides of the CdS single crystal to make a laser structure. The embodiments 1 through 6 are six types of reflectors which consisted of photonic crystals. An aluminum film reflector was made as a comparative example.

A method for making a reflector using anodized alumina will be described below. Aluminum film 1 μm thick is formed on a CdS single crystal by deposition. Any method, such as sputtering, CVD, or vacuum metallization, can be used to form such film. Before anodization, concaves are formed on the surface of the aluminum film to provide nanohole start points for anodization. This operation allows nanoholes to be regularly arrayed in alumina. To make nanoholes with a high aspect ratio, it is preferable that the concaves be formed in honeycomb formation opposite to an array of nanoholes in anodized alumina. To form nanohole start points (concave), methods can be used, including a method which emits a focused ion beam (FIB), a method which makes hollows by such press patterning as disclosed in Japanese Patent Application Laid-Open No. 10-121292, a method which uses SPM including AFM, a method which makes hollows by etching after resist patterns are formed, and the like.

Of these methods, the method which uses a focused ion beam is the best for the following reasons. That is, the method does not need troublesome steps, such as resist application, electron-beam exposure, and resist removal. The method also allows nanohole start points to be formed by direct drawing at desired positions a short time and eliminates the need for a workpiece to be pressurized. Thus the method can be used for a workpiece which is not mechanically strong. By emitting a focused Ga ion beam, dots of concaves were formed at 190 nm intervals in honeycomb formation. Here, Ga was used as an ion species for focused ion beam processing, the acceleration voltage was 30 kV, the ion beam diameter was 100 nm, and the ion current was 300 pA. A focused ion beam was irradiated to each dot for 10 msec.

Figure 16:
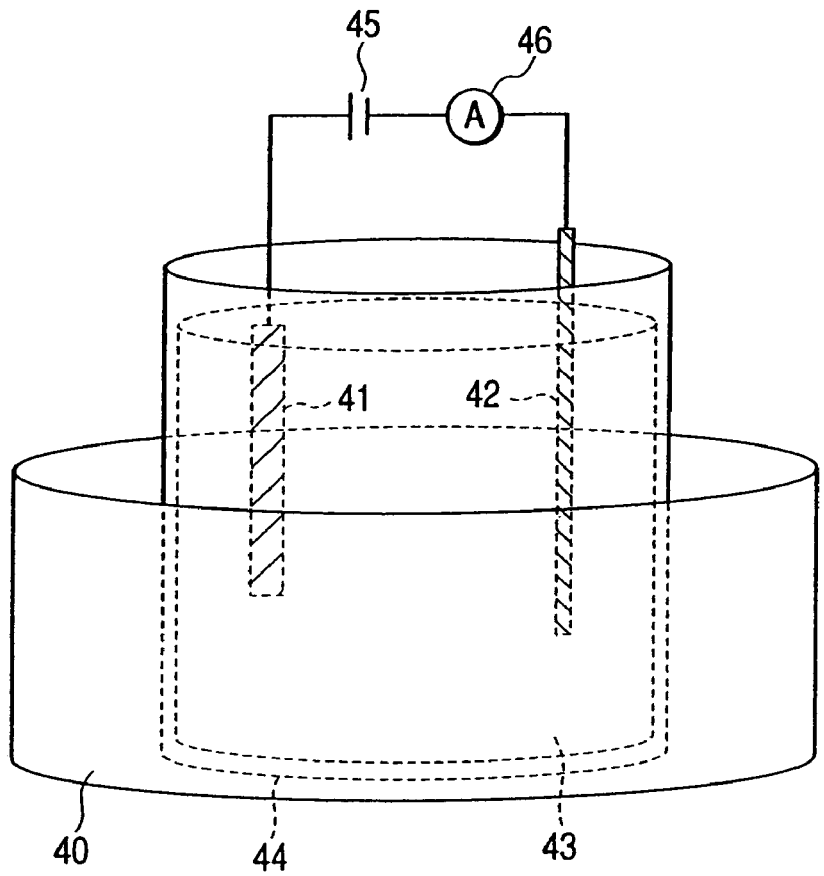
FIG. 16 shows an apparatus which produces two-dimensional photonic crystals with anodized aluminum.
Figure 17:
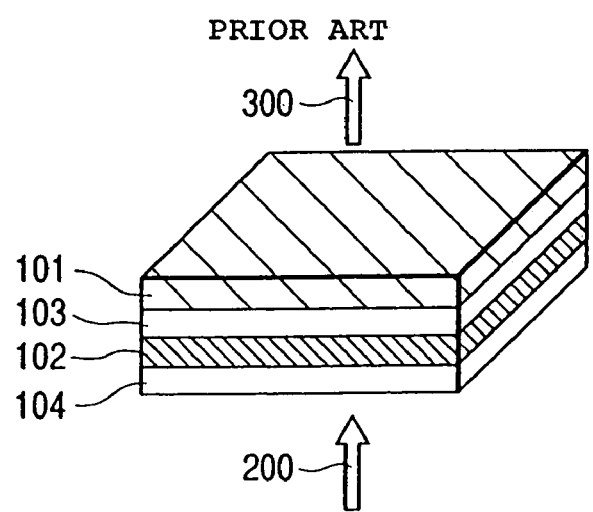
FIG. 17 shows a conventional electron-beam excitation laser.

The above-described alumina film was anodized to make nanoholes. FIG. 16 shows an apparatus which make anodized-alumina nanoholes. In the figure, a reference numeral 40 indicates a thermostatic bath; 41, a sample; 42, a Pt cathode (a Pt electrode); 43, an electrolyte; 44, a reaction bath; 45, a power supply which applies anodization voltage; 46, an ammeter which measures anodization current. In addition, the apparatus incorporates a computer and the like to automatically control and measure the voltage and current, which are not shown in FIG. 16. The sample 41 and cathode 42 are immersed in the electrolyte whose temperature is kept constant in the thermostatic bath. The power supply 45 applies a voltage between the sample 41 and cathode 42 to anodize the sample. The electrolyte used for anodizution is, for example, a solution of oxalic acid, phosphoric acid, sulfuric acid, or chromic acid.

Because the interval between nanoholes, that is, the structural interval relates with anodization voltage as expressed by the following equation, it is desirable that the anodization voltage be set according to a start point array (a structural interval).

$$2R = 2.5 \times Va$$

2R (nm): nanohole interval

Va (V): anodization voltage

Alumina nanohole depth can be controlled by adjusting aluminum film thickness or anodization time. For example, nanoholes can be made to penetrate through the entire film thickness, or aluminum film with a desired thickness can be left. By immersing an alumina nanohole layer in an acid solution (for example, a phosphoric solution), (pore wide treatment), nanoholes can be enlarged as appropriate. In addition, by controlling acid concentration, treatment time, and temperature, alumina nanoholes with a desired diameter can be formed. In the embodiment, an alumina nanohole layer was anodized in a 0.3M phosphoric bath at 75V. The layer was also subjected to the pore wide treatment, that is, immersed in a 5 wt % phosphoric acid solution at 25° C. for 70 minutes to enlarge nanoholes until their diameter reached 150 nm.

Laser structures in Embodiments 1 through 6 will be described below. In Embodiment 1, almost the entire aluminum film was converted into anodized alumina film to make such a laser structure that the light emitter 4 is interposed between alumina films (2D photonic crystals) as shown in FIG. 12A. In Embodiment 2, anodization was completed when aluminum film 100 nm thick was left. That is, the light emitter was sandwiched by aluminum films, which, in turn, were sandwiched by alumina nanoholes (2D photonic crystals).

In Embodiment 3, Ag film 100 nm thick, which serves as a reflecting film and antistatic film, was formed on the anodized alumina film in Embodiment 1. As is the case with Embodiment 2, in Embodiment 4, aluminum film on one side only was anodized to obtain anodized alumina film, and an electron-beam was irradiated to the film from the side of the anodized alumina film. As is the case with Embodiment 2, in Embodiment 5, aluminum film on one side only was anodized to obtain anodized alumina film, and an electron-beam was irradiated to the film from the side of aluminum film. In Embodiment 6, niobium film was formed on aluminum film and anodized to form anodized alumina film in which nanoholes were made horizontally (i.e., in parallel with the film surface) as shown in FIG. 12B. That is, in Embodiment 6, electrons were incident in the direction in which the 2D photonic crystal is periodic. In Comparatibe Example 1, anodization was not performed, so that aluminum film 100 nm thick was directly used as reflectors.

The thus produced laser structures in Embodiments 1 through 6 were evaluated using a laser structure in Comparative Example 1. These laser structures which use a light emitter consisting of a CdS single crystal and reflectors consisting of 2D photonic crystals were placed in a vacuumizer, and vacuumization was performed until a pressure of $10^{-6}$ Pa was reached. Next, the laser structures were cooled to a liquid nitrogen temperature, and electrons emitted from an opposite electron gun made of $LaB_6$ were accelerated to an acceleration voltage of 10 to 50 keV and irradiated to the structures. As a result, green light with a wavelength around 520 nm was obtained by laser oscillation. Specifically, the laser oscillation threshold value was 15 to 20 $A/cm^2$ for the laser structure in Embodiment 1. On the other hand, the value was 20 to 50 $A/cm^2$ for the laser structure in Comparative Example 1.

Embodiments 2 and 3 needed a little higher acceleration voltage than Embodiment 1. However, Embodiment 1 allowed oscillation by low-current excitation, so that oscillation was highly stable over time. Although the laser oscillation wavelength range was a little wider in Embodiment 4, compared with Embodiment 2, Embodiment 4 allowed oscillation at a low oscillation threshold value. In Embodiment 5, the oscillation threshold value was high as in Comparative Example 1. However, in Embodiment 5, the laser oscillation wavelength range was slightly narrower than in Comparative Example 1. For the laser structure in Embodiment 6, the laser oscillation threshold value was low, at 10 to 15 $A/cm^2$. In Embodiments 1, 2, 3, and 6, especially Embodiment 6, the laser oscillation wavelength range was narrow, and a reduced number of laser oscillation modes were available. The results obtained from Embodiments 1 through 6 show that using a 2D photonic crystal made from anodized alumina for a reflector in a laser structure reduces laser oscillation threshold current.

By filling nanoholes in anodized alumina film (a 2D photonic crystal) with a light-emitting material, four types of laser structure with a light emitter was made to evaluate them. The structures, which are as shown in FIGS. 13A and 14A, correspond to Embodiments 7 through 10. Anodized alumina film whose nanoholes were filled with ZnO, that is, a photonic alumina crystal in which ZnO rods were arrayed two-dimensionally was used for the light emitter 4.

Specifically, Nb film 100 nm thick was formed on a quartz substrate, then aluminum film 1 μm thick was formed on the Nb film by DC sputtering. Next, as is the case with Embodiment 1, the aluminum film was anodized to make alumina nanoholes. These nanoholes were formed at 140 nm intervals in honeycomb formation. Then the aluminum film was anodized at 56 V, using a 0.3M phosphoric acid bath. Finally, the film was subjected to pore wide treatment, that is, immersed in a 5 wt % phosphoric acid solution at 25° C. for 50 minutes to enlarge nanoholes until their diameter reached about 110 nm.

By electrodeposition, the nanoholes were filled with ZnO to make a light emitter. The substrate was immersed in a 0.1M zinc nitrate solution at 60° C. together with an opposite Pt electrode. Next, a voltage of about −5 V was applied to the substrate to form ZnO crystals in the nanoholes. In Embodiment 7, ZnO crystals were let to grow until they protruded from the nanoholes, and then the substrate surface was polished. In Embodiment 8, ZnO was deposited in the nanoholes until a nanohole depth of about 300 nm was reached (Embodiments 7 and 8 correspond to the laser structure in FIG. 13A). The substrate was heat-treated in a He atmosphere at 400° C. for one hour and overlaid with Ag film 100 nm thick by vapor deposition to make a light emitter.

In Embodiment 9 (corresponding to FIG. 14A), Nb film strips 5 μm wide were made, then aluminum film was formed over these strips and anodized to fill nanoholes with ZnO. ZnO was deposited on those parts of the aluminum film having an underlying Nb film (5 μm wide) were present. That is, some of the nanoholes in the anodized alumina film (the 2D photonic crystal) were filled with the light-emitting material. In Embodiment 10, a beam of more ions were locally irradiated to the substrate during anodized alumina production to form shallow start points. As a result, anodized alumina nanoholes which locally had a smaller diameter were formed as shown in FIG. 11 (the structure in FIG. 13A was provided with defects in embodiment 10).

The thus produced laser structures in Embodiments 7 through 10 were placed in a vacuumizer, and vacuumization was performed until a pressure of $10^{-6}$ Pa was reached. Next, the laser structures were cooled to a liquid nitrogen temperature, and electrons were emitted from an opposite electron gun made of $LaB_6$ to irradiate a beam of electrons accelerated to an acceleration voltage of 10 to 50 keV to the structures. As a result, laser oscillation could be caused near a ultraviolet wavelength of 390 nm. The laser oscillation threshold value was 15 to 20 $A/cm^2$ for the laser structures. On the other hand, the value was 20 to 50 $A/cm^2$ for a laser structure in Comparative Example 2, which was formed by depositing ZnO and Ag on Nb film.

As described above, the results show that using a 2D photonic crystal made from anodized alumina for a reflector in a laser structure reduces laser oscillation threshold current. In Embodiments 7 through 10, especially Embodiments 8 and 9, the laser oscillation wavelength range was narrow, and a reduced number of laser oscillation modes were available. In Embodiment 10, a mode due to defects was found. In Embodiments 7 through 10, introducing a light emitter into a photonic crystal probably caused the oscillation threshold value to decrease with decreasing group velocity.

In Embodiment 8, parts which contained almina nanoholes about 700 nm high unfilled with ZnO possibly served as photonic crystals (reflectors). In Embodiment 9, that anodize alumina film on the sides of the light emitter consisting of a photonic crystal whose nanoholes were not filled probably served as a reflector in the photonic crystal to effectively contain light. In Embodiment 10, defects in the 2D photonic crystal (anodized alumina film) may have contributed to laser oscillation.

In Embodiment 11, a laser structure which uses a GRINSH (graded index separate confinement) type ZnCdSe/ZnSe heterostructure produced by MBE for a light emitter was made and evaluated. The laser structure corresponds to FIG. 12A. The light emitter has a heterostructure. The heterostructure consists of a 1 μm thick ZnSe buffer layer on an InGaAs (100) substrate and a quantum well which is made from $Zn_{0.75}Cd_{0.25}Se$ interposed between refractive-index change layers of Zn1-xCdxSe (x=0 to 0.05) and is disposed on top of the buffer layer. The refractive-index change layer is 500 nm thick.

A reflector made from anodized alumina was formed on the heterostructure in the same was as in Embodiment 2 to make the laser structure. In the embodiment, start points were arrayed at 170-nm intervals in honeycomb formation, and anodization was performed at 68 V in a 0.3M phosphoric acid bath. Finally, the laser structure was subjected to pore wide treatment, that is, immersed in a 5 wt % phosphoric acid solution at 25° C. for 70 minutes to enlarge nanoholes until their diameter reached about 140 nm.

A spint type electron source was provided which has $10^4$ to $10^5$ Mo chips per square millimeter. The thus produced laser structure was placed opposite to the spint type electron source in a glass container. After the container was evacuated, it was hermetically sealed. As electron accelerating means, a high-voltage power supply was connected to the electron source and laser structure. When a beam of electrons accelerated to an acceleration voltage of 10 to 50 keV was irradiated to the structure, blue light with a wavelength around 480 nm was obtained by laser oscillation. For the embodiment, the laser oscillation threshold value was 0.3 to 0.5 mA/cm². On the other hand, for a comparative example where no anodized alumina film was disposed, the value was 0.5 to 1 mA/cm². The laser oscillation wavelength range was found to be narrow, and a reduced number of laser oscillation modes were found to be available.

In Embodiment 12, by electron-beam lithography, a wafer with an InGaAsP/InP multiplex quantum well active layer was given a 2D photonic crystal structure to make a laser structure. The laser structure was evaluated. It is as shown in FIG. 14C. A wafer was provided by letting a 200 nm thick InGaAs etching stop layer, a 100 nm thick InP layer, an SCH (separate confinement heterostructure) multiplex quantum well active layer, and 100 nm thick InP layer 15 grow on an InP substrate. The active layer consists of an SCH layer 50 nm thick which is made from InGaAsP (band gap energy wavelength λg=1.1 μm), an InGaAsP well 7 nm thick (λg=1.36 μm), and an InGaAsP barrier layer 15 nm thick (λg=1.1 μm).

$SiO_2$ film was formed on the wafer, and photoresist was applied to the wafer to form such a resist mask that circular openings 250 nm in radius are arrayed at 460-nm intervals in hexagonal lattice formation. Using the resist mask, the circular-opening pattern was transferred onto $SiO_2$ film by reactive ion etching. Using the $SiO_2$ mask, two-dimensional hole rows were formed on the wafer. Finally, the $SiO_2$ mask was removed to make a laser structure.

An electron source was made by forming nitrogen-doped diamond film on a silicone substrate by hot-filament CVD under the following conditions: (1) tungsten filament temperature=2300° C., (2) substrate temperature=800° C., (3) reaction pressure=100 torr, and (4) ratio of reactive gas to hydrogen 0.6%. The reactive gas was provided by saturating methanol with $(NH_2)_2CO$, diluting the saturated solution ten times with acetone, and vaporizing the dilution.

In this way, a laser structure was made whose light emitter and reflectors consist of 2D photonic crystals, with the emitter interposed vertically between the reflectors. In a vaccumizer, the laser structure was placed opposite to the electron source with a 2 mm separation in between. When electrons were emitted from the electron source to irradiate a beam of electrons accelerated to an acceleration voltage of 10 to 50 keV to the structure, laser oscillation could be caused near a wavelength of 1.3 μm. The laser oscillation threshold value was 0.2 to 0.5 mA/cm². On the other hand, the value was 0.5 to 0.8 mA/cm² for a comparative example in which no two-dimensional rows were provided. The embodiment shows that using a laser structure whose reflectors consist of 2D photonic crystals reduces the oscillation threshold value. For the embodiment, the laser oscillation wavelength range was found to be narrow, and a reduced number of laser oscillation modes were found to be available.

In Embodiment 13, a laser structure whose reflectors consist of 3D photonic crystals of dielectric spheres was made and evaluated. The 3D photonic crystal in FIG. 10C, metal reflecting film, and ZnO film were used for the reflector 6, reflector 5, and light emitter 4, respectively. ZnO film was formed on a sapphire (0001) substrate by laser MBE to make the ZnO light emitter. To form the film, a KrF excimer laser beam was irradiated to a ZnO sintered target at an oxygen partial pressure of $1\times10^{-6}$ torr and a substrate temperature of 550° C. to evaporate ZnO. The resulting film was about 60 nm thick.

Drops of a water solution (4 wt %) in which particles 170 nm in diameter (standard deviation of 3%) made from polystyrene were dispersed were let to fall to evaporate water. As a result a reflector was formed in which, polystyrene particles structured themselves three-dimensionally and arranged. Ag film 100 nm thick was formed as antistatic and reflecting film on the face of the substrate. Ag film 200 nm thick was formed as reflecting film on the back of the substrate.

In this way, a laser structure was made which has reflectors consisting of such 3D photonic crystals that dielectric spheres are arrayed on top of a ZnO light emitter. The laser structure was placed in a vacuumizer. When electrons were emitted from an $LaB_6$ electron gun opposite to the laser structure to irradiate a beam of electrons accelerated to an acceleration voltage of 10 to 50 keV to the structure, ultraviolet light with a wavelength near 390 nm could be caused by laser oscillation. The laser oscillation threshold value was 0.1 to 0.4 A/cm². On the other hand, the value was 0.5 to 1 A/cm$^2$ for Comparative Example 3 in which no polystyrene particles were disposed. The embodiment shows that using a laser structure whose reflectors consist of 3D photonic crystals formed with arrayed polystyrene particles reduces the oscillation threshold value. For the embodiment, the laser oscillation wavelength range was found to be narrow, and a reduced number of laser oscillation modes were found to be available.

In Embodiment 14, a laser structure was made whose light emitter has a 3D photonic crystal structure and subjected to evaluation test. The light emitter 4 has a structure as shown in FIG. 10C. The structure is formed by placing (CdS) illuminants between dielectric spheres 25. Metal reflecting film is used for the reflectors 5 and 6. Specifically, the following process was repeated to make such a 3D photonic crystal structure that illuminants are placed between dielectric spheres 25. As is the case with Embodiment 13, particles 380 nm in diameter made from polystyrene are dispersed and arrayed on a quartz substrate. Then the substrate is first immersed in a 0.025M CdSO$_4$ solution and then in an S=C(NH$_2$)$_2$ solution. This operation is repeated. During operation, both solutions are kept at 60° C. Ammonia is dissolved as a catalyst in both solutions. Ag reflecting film 100 nm thick was formed on the face and back of the substrate.

In this way, a laser structure was made whose light emitter has such a 3D photonic crystal structure that illuminants are placed between dielectric spheres 25. The laser structure was place in a vacuumizer. When electrons were emitted from an LaB$_6$ electron gun opposite to the laser structure to irradiate a beam of electrons accelerated to an acceleration voltage of 30 to 80 keV to the structure, green light with a wavelength near 520 nm could be caused by laser oscillation. For the embodiment, the laser oscillation threshold value was lower, compared with Comparative Example 4 where no polystyrene particles were disposed. That is, in the embodiment, using the laser structure whose light emitter has such a 3D photonic crystal structure that illuminants are placed between dielectric spheres reduced threshold current density and the number of laser oscillation modes and narrowed the laser oscillation wavelength range.

As described above, the present invention has the following advantages:

(1) Using a laser structure with reflectors consisting of multidimensional photonic crystals improves resonator performance and laser emission efficiency. Using such a laser structure also narrows the laser oscillation wavelength range and provides an electron-beam excitation laser which operates in a reduced number of laser oscillation modes. Especially, making some of the dielectrics constituting a photonic crystal vacuum causes the substantial intensity of an electron beam reaching the light emitter to increase. Thus the laser oscillation threshold current density and threshold voltage can be reduced.

(2) Using a multidimensional photonic crystal for a light emitter in a laser structure provides an electron-beam excitation laser which features increased laser emission efficiency, a narrow laser oscillation wavelength range, and a reduced number of laser oscillation modes available.

(3) Using multidimensional photonic crystals for reflectors and a light emitter in a laser structure provides higher performance, compared with using a multidimensional photonic crystal for either the reflectors or light emitter.

(4) Making a multidimensional photonic crystal from anodized alumina allows an electron-beam excitation laser to be easily produced at low cost.

What is claimed is:

1. An electron-beam excitation laser comprising an electron source to emit electrons, a first reflector, a second reflector and a light emitter between said first and second reflectors, wherein at least one of said reflectors has a multidimensional photonic crystal structure, and the multidimensional photonic crystal structure is comprised of a periodic arrangement of first and second dielectrics that are different from each other in dielectric constant, and the second dielectrics consist of a vacuum part.

2. The electron-beam excitation laser according to claim 1, wherein the multidimensional photonic crystal structure is comprised of a two-dimensional periodic arrangement, and said vacuum part is obtained by locating said multidimensional photonic crystal structure in a vacuum.

3. The electron-beam excitation laser according to claim 1, wherein a part of the multidimensional photonic crystal structure has defects to disturb a periodicity in the multidimensional photonic crystal structure.

4. The electron-beam excitation laser according to claim 3, wherein the defects are dielectrics which differ in size from other dielectrics.

5. The electron-beam excitation laser according to claim 1, wherein the multidimensional photonic crystal structure, which is formed by anodizing aluminum, has such an anodized alumina nanohole structure that cylindrical nanoholes are regularly and two-dimensionally arrayed in an alumina layer.

6. The electron-beam excitation laser according to claim 1, wherein said light emitter is formed with a multidimensional photonic crystal in which dielectrics with different dielectric constants are arrayed in a plurality of directions at periodic intervals, and one of the dielectrics with different dielectric constants is fanned with a light-emitting material.

7. The electron-beam excitation laser according to claim 1, wherein said light emitter and reflectors are formed with multidimensional photonic crystals in which dielectrics with different dielectric constants are arrayed in a plurality of directions at periodic intervals, and one of the dielectrics with different dielectric constants in the multidimensional photonic crystal forming said light emitter is formed with a light-emitting material.

8. An electron-beam excitation laser comprising an electron source, and a member being located in a direction of electrons emitted from the electron source and generating a laser beam, said member comprising a first reflector, a light emitter and a second reflector in this order from an end facing the electron source, and at least one of the first reflector, the second reflector and the light emitter have a periodic structure, and the periodic structure is comprised of a periodic arrangement of first and second dielectrics that are different from each other in dielectric constant, and the second dielectrics consist of a vacuum.

9. The electron-beam excitation laser according to claim 8, wherein at least part of the periodic structure includes a defect disturbing periodicity of the periodic structure.

10. The electron-beam excitation laser according to claim 8, wherein said first reflector has the periodic structure.

11. The electron-beam excitation laser according to claim 8, wherein said second reflector has the periodic structure.

12. The electron-beam excitation laser according to claim 8, wherein said light emitter has the periodic structure.

13. The electron-beam excitation laser according to claim 8, wherein both said first reflector and said second reflector have the periodic structure.

14. An apparatus which is comprised of a plurality of electron-beam excitation lasers, each being an electron-beam excitation laser according to claim 8.

15. An electron-beam excitation laser comprising an electron source which emits electrons and a laser structure which is comprised of a light emitter and reflectors located on both sides of the light emitter, wherein the reflector on the side irradiated from the electron source is comprised of a photonic crystal structure in which a first portion having a first dielectric constant and a second portion having a second dielectric constant are periodically arranged, and one of the first and second portions is a vacuum portion.

16. The electron-bean excitation laser according to claim 15, wherein said photonic crystal structure is a two-dimensional photonic crystal structure, which is irradiated with electrons from a direction perpendicular to a direction of periodicity of the crystal structure.

17. The electron-beam excitation laser according to claim 15 or 16, wherein said photonic crystal structure has a defect partly to disturb periodicity in the multidimensional photonic crystal structure.

18. The electron-beam excitation laser according to claim 15 or 16, wherein said photonic crystal structure is an anodized alumina nanohole structure wherein cylindrical nanoholes are regalatly and two-dimensionally arrayed in an anodized alumina layer.

19. The electron-beam excitation laser according to claim 15 or 16, wherein a photonic crystal structure is formed in said light emitter.

20. A multi electron-beam excitation laser comprising a plurality of electron-beam excitation lasers, each being an electron-beam excitation laser according to claim 15, wherein an outputting by a plurality of laser beams can be carried out.

21. An electron-beam excitation laser comprising an electron source, a first reflector, an active layer and a second reflector comprised of a photonic crystal, wherein an electron is emitted from the electron source to the active layer via the second reflector, the second reflector is comprised of dielectrics periodically arranged at specific intervals or dielectrics having holes periodically arranged at specific intervals, and the second reflector is located in a vacuum.

* * * * *

UNITED STATES PATENT AND TRADEMARK OFFICE
CERTIFICATE OF CORRECTION

| | |
|---|---|
| PATENT NO. | : 7,126,975 B2 |
| APPLICATION NO. | : 10/861290 |
| DATED | : October 24, 2006 |
| INVENTOR(S) | : Tatsuya Iwasaki et al. |

It is certified that error appears in the above-identified patent and that said Letters Patent is hereby corrected as shown below:

ON THE TITLE PAGE ITEM [56] REFERENCES CITED:

Other Publications, "Oxidize" should read --Oxidized--.

ON THE TITLE PAGE ITEM [75]:

Inventors, "Tatsuya Iwasaki, Tokyo (JP);" should read --Tatsuya Iwasaki, Machida (JP);--.

COLUMN 5:

Line 56, "$Y_2O_3:Eu^{3+}In_2O_3$." should read --$Y_2O_3:Eu^{3+}+In_2O_3$.--.

COLUMN 6:

Line 38, "trianglerly" should read --triangularly--.

COLUMN 8:

Line 25, "Thes," should read --Thus,--.

COLUMN 10:

Line 3, "consisted" should read --consist--.

COLUMN 11:

Line 37, "Comparatibe" should read --Comparative--.

COLUMN 12:

Line 32, "let" should read --allowed--.

COLUMN 14:

Line 54, "arranged." should read --were arranged.--

UNITED STATES PATENT AND TRADEMARK OFFICE
CERTIFICATE OF CORRECTION

PATENT NO. : 7,126,975 B2
APPLICATION NO. : 10/861290
DATED : October 24, 2006
INVENTOR(S) : Tatsuya Iwasaki et al.

It is certified that error appears in the above-identified patent and that said Letters Patent is hereby corrected as shown below:

COLUMN 18:

Line 2, "regalatly" should read --regularly--.

Signed and Sealed this

Sixth Day of May, 2008

JON W. DUDAS
*Director of the United States Patent and Trademark Office*